(12) United States Patent
Yoshimoto et al.

(10) Patent No.: US 7,732,531 B2
(45) Date of Patent: Jun. 8, 2010

(54) MOLDED OBJECT PROCESS FOR PRODUCING THE SAME PRODUCT FOR HIGH-FREQUENCY SIGNAL TRANSMISSION AND HIGH-FREQUENCY TRANSMISSION CABLE

(75) Inventors: Hiroyuki Yoshimoto, Settsu (JP); Yasuhiko Sawada, Settsu (JP); Shunji Kasai, Settsu (JP); Shuji Tagashira, Settsu (JP)

(73) Assignee: Daikin Industries, Ltd., Osaka-shi (JP)

( * ) Notice: Subject to any disclaimer, the term of this patent is extended or adjusted under 35 U.S.C. 154(b) by 861 days.

(21) Appl. No.: 10/569,452

(22) PCT Filed: Aug. 25, 2004

(86) PCT No.: PCT/JP2004/012211

§ 371 (c)(1),
(2), (4) Date: Feb. 24, 2006

(87) PCT Pub. No.: WO2005/019336

PCT Pub. Date: Mar. 3, 2005

(65) Prior Publication Data

US 2006/0293459 A1    Dec. 28, 2006

(30) Foreign Application Priority Data

Aug. 25, 2003    (JP)    ............... 2003-300639

(51) Int. Cl.
C08L 27/12    (2006.01)
C08L 23/00    (2006.01)
C08L 23/04    (2006.01)
C08L 23/10    (2006.01)
C08F 6/20    (2006.01)

(52) U.S. Cl. ............ 525/199; 525/240; 524/546
(58) Field of Classification Search ............ 525/199, 525/240; 524/546
See application file for complete search history.

(56) References Cited

U.S. PATENT DOCUMENTS

| | | | |
|---|---|---|---|
| 3,019,206 A | 1/1962 | Robb | |
| 3,925,292 A | 12/1975 | Holmes | |
| 3,962,373 A | 6/1976 | Petrucelli | |
| 4,012,551 A | 3/1977 | Bogaty et al. | |
| 4,252,859 A | 2/1981 | Concannon et al. | |
| 4,454,249 A | 6/1984 | Suzuki et al. | |
| 4,469,846 A | 9/1984 | Khan et al. | |
| 4,555,543 A | 11/1985 | Effenberger et al. | |
| 4,624,990 A | 11/1986 | Lunk et al. | |
| 5,041,500 A | 8/1991 | Ishiwari et al. | |
| 5,094,806 A * | 3/1992 | Laughner | 264/523 |
| 5,324,785 A | 6/1994 | Noda et al. | |
| 5,494,752 A | 2/1996 | Shimizu et al. | |
| 5,549,948 A * | 8/1996 | Blong et al. | 428/36.9 |
| 5,567,770 A | 10/1996 | Luise | |
| 5,607,766 A | 3/1997 | Berger | |
| 5,620,641 A | 4/1997 | Berger | |
| 5,633,082 A | 5/1997 | Berger | |
| 6,025,441 A * | 2/2000 | Koshirai et al. | 525/199 |
| 6,127,486 A * | 10/2000 | Burger et al. | 525/199 |
| 6,239,223 B1 | 5/2001 | Effenberger et al. | |
| 6,310,141 B1 | 10/2001 | Chen et al. | |
| 6,417,280 B2 | 7/2002 | Effenberger et al. | |
| 6,531,559 B1 * | 3/2003 | Smith et al. | 526/255 |
| 6,538,069 B2 | 3/2003 | Faulkner | |
| 6,696,512 B2 | 2/2004 | Poggio et al. | |
| 6,867,261 B2 | 3/2005 | Bladel et al. | |
| 6,977,280 B2 * | 12/2005 | Lee et al. | 525/199 |
| 2002/0001277 A1 | 1/2002 | Thomas | |
| 2003/0216531 A1 | 11/2003 | Aten et al. | |
| 2004/0112627 A1 | 6/2004 | Yamamoto et al. | |
| 2006/0121288 A1 | 6/2006 | Mochizuki et al. | |
| 2006/0122333 A1 | 6/2006 | Nishio | |
| 2007/0124944 A1 | 6/2007 | Thoene et al. | |
| 2007/0281166 A1 | 12/2007 | Nishio | |

FOREIGN PATENT DOCUMENTS

| | | |
|---|---|---|
| EP | 0 138 524 A1 | 4/1985 |
| EP | 0 521 588 A2 | 1/1993 |
| EP | 0 700 417 B1 | 3/1996 |
| JP | 7-216102 | 8/1995 |
| JP | 7-216102 A | 8/1995 |
| JP | A-8-510784 | 11/1996 |

(Continued)

OTHER PUBLICATIONS

William D. Callister, Jr., Materials Science and Engineering: An Introduction, 2003, John Wiley & Sons, Inc., Sixth Edition, pp. 733-764 (740, 753).

Lynch, Charles T., ed. Practical Handbook of Materials Science. Section 12: Polymeric Materials. pp. 547-573. CRC Press, Inc., Boca Raton, Florida: 1989.

Gangal, Subhash V. Encyclopedia of Polymer Science and Technology. vol. 3 pp. 422-435. Perfluorinated Polymers, Tetrafluoroethylene-Perfluorovinyl Ether Copolymers. John Wiley & Sons, Inc.

*Primary Examiner*—Nathan M Nutter
(74) *Attorney, Agent, or Firm*—Birch, Stewart, Kolasch & Birch, LLP

(57) ABSTRACT

The present invention provides a molded article comprising a polytetrafluoroethylene resin (A) and a thermoplastic resin (B) having a melting point of not lower than 100° C. but lower than 322° C., wherein the maximum peak temperature of the endothermic curve appearing on the crystal melting curve of the above polytetrafluoroethylene resin (A) as measured by a differential scanning calorimeter is higher by at least 3° C. than the maximum peak temperature of the endothermic curve appearing on the crystal melting curve of the above polytetrafluoroethylene resin (A) after heating to a temperature of not lower than 340° C. as measured by the differential scanning calorimeter.

19 Claims, No Drawings

FOREIGN PATENT DOCUMENTS

| | | |
|---|---|---|
| JP | 9-71704 | 3/1997 |
| JP | 9-071704 A | 3/1997 |
| JP | 11-31422 A | 2/1999 |
| JP | 11-31442 | 2/1999 |
| JP | 11-283448 | 10/1999 |
| JP | 2000-143922 | 5/2000 |
| JP | 2000-143922 A | 5/2000 |
| JP | 2001-357729 | 12/2001 |
| JP | 2001-357729 A | 12/2001 |
| JP | 2001-357730 | 12/2001 |
| JP | 2001-357730 A | 12/2001 |
| WO | WO-93/20563 A1 | 10/1993 |
| WO | WO 94/28069 | 12/1994 |
| WO | WO-01/97234 A1 | 12/2001 |

\* cited by examiner

MOLDED OBJECT PROCESS FOR PRODUCING THE SAME PRODUCT FOR HIGH-FREQUENCY SIGNAL TRANSMISSION AND HIGH-FREQUENCY TRANSMISSION CABLE

TECHNICAL FIELD

This invention relates to a molded article, a method of producing a molded article, a product for high-frequency signal transmission, and a high-frequency transmission cable.

BACKGROUND ART

For products for high-frequency signal transmission, for example for coaxial cables, cables for LAN and printed wiring boards, the dielectric loss of the insulating material is an important factor.

The dielectric loss is a function of the permittivity ($\in$) and dielectric loss tangent (tan δ). The smaller that loss is, the more preferable the insulating material is.

Polytetrafluoroethylene [PTFE] is known as a material for insulators low in permittivity and dielectric loss tangent. PTFE has so far been molded by heating at above the melting point for effecting sintering.

With the recent advances in high-frequency signal transmission technology, high levels of transmission characteristics have become needed. For lowering the permittivity ($\in$) and dielectric loss tangent (tan δ) to thereby reduce the dielectric loss, it has been proposed that PTFE be used in a non-sintered or semi-sintered condition. However, non-sintered or semi-sintered PTFE had a problem in that it is poor in mechanical strength.

High-frequency transmission cables such as coaxial cables are sometimes subjected to terminal processing comprising cutting off the end portion of the coating in the lengthwise direction, with core wires being left as they are. The use of non-sintered or semi-sintered PTFE as an insulating coating material for coating core wires produces a poor terminal processability problem; namely, upon terminal processing, fiberization occurs at the cut end.

For maintaining the permittivity and dielectric loss tangent of the insulating coating material of coaxial cables at levels as low as possible and improving the mechanical strength thereof, it has been proposed that the sintering degree in an insulating coating material composed of non-sintered PTFE and sintered PTFE be inclined in the radial direction so that the sintering degree on the outer surface side of PTFE may be increased (cf. e.g. Patent Document 1: Japanese Kokai Publication H11-31422).

For improving the terminal processability of insulating coating materials, it has been proposed that the terminal portion alone, which is to be subjected to terminal processing, be made of fully sintered PTFE and the other portion be made of non-sintered PTFE or semi-sintered PTFE so as to give a gradient in sintering degree in the lengthwise direction of the core wires (cf. e.g. Patent Document 2: Japanese Kokai Publication H11-283448).

These insulating coating materials are lower in dielectric loss tangent than those made of sintered PTFE alone as the resin but still have a problem: they have a portion constituted of non-sintered PTFE and, therefore, insufficient in mechanical strength and/or terminal processability.

It has also been proposed that a mixture of PTFE (a) with a number average molecular weight of $10\pm5\times10^5$ and PTFE (b) with a number average molecular weight of $45\pm10\times10^5$ is sintered at a temperature not lower than the melting point of PTFE (a) but lower than the melting point of PTFE (b) to give an insulating coating material comprising semi-sintered PTFE (cf. e.g. Patent Document 3: Japanese Kokai Publication 2001-357729). This insulating coating material is low in permittivity and dielectric loss tangent and improved in terminal processability. However, higher levels of mechanical strength and terminal processability are now required.

In this way, various investigations have been made concerning the sintering degree, among others, of PTFE as an insulating coating material for high-frequency signal transmission products. As for other fluororesins than PTFE and other resins, however, they are higher in both permittivity and dielectric loss tangent than PTFE, so that they have not yet been made targets of investigation as materials of insulators.

DISCLOSURE OF INVENTION

Problems which the Invention is to Solve

In view of the state of the art as discussed above, it is an object of the present invention to provide a molded article excellent in electrical characteristics, including dielectric loss tangent and permittivity, and in terminal processability and mechanical strength.

Means for Solving the Problems

The present invention provides a molded article comprising a polytetrafluoroethylene resin (A) and a thermoplastic resin (B) having a melting point of not lower than 100° C. but lower than 322° C., wherein the maximum peak temperature of the endothermic curve appearing on the crystal melting curve of the above polytetrafluoroethylene resin (A) as measured by a differential scanning calorimeter is higher by at least 3° C. than the maximum peak temperature of the endothermic curve appearing on the crystal melting curve of the above polytetrafluoroethylene resin (A) after heating to a temperature of not lower than 340° C. as measured by the differential scanning calorimeter.

The present invention also provides a method of producing a molded article comprising subjecting a polytetrafluoroethylene resin (A) and a thermoplastic resin (B) having a melting point of not lower than 100° C. but lower than 322° C. to heat treatment at a specific resin temperature, wherein the above specific resin temperature is not lower than the melting point of the above thermoplastic resin (B) but lower than the melting point of the above polytetrafluoroethylene resin (A).

The present invention further provides a product for high-frequency signal transmission comprising the above molded article.

The present invention further provides a high-frequency transmission cable, which comprises the above molded article as an insulating coating layer.

In the following, the present invention is described in detail.

The molded article of the invention comprises a polytetrafluoroethylene resin (A) and a thermoplastic resin (B) having a melting point of not lower than 100° C. but lower than 322° C.

The fluoropolymer constituting the above polytetrafluoroethylene resin (A) may be a tetrafluoroethylene [TFE] homopolymer, or a copolymer of TFE and a minor constituent monomer other than TFE which is not melt-processable (hereinafter referred to as "modified polytetrafluoroethylene [modified PTFE]").

The minor constituent monomer may be, for example, a perfluoroolefin, a perfluoro(alkyl vinyl ether), a fluorinated cyclic monomer, or a perfluoroalkylethylene.

The perfluoroolefin includes hexafluoropropylene [HFP] and the like, the perfluoro(alkyl vinyl ether) includes perfluoro(methyl vinyl ether), perfluoro(propyl vinyl ether) and the like, the fluorinated cyclic monomer includes fluorodioxole and the like, and the perfluoroalkylethylene includes perfluoromethylethylene and the like.

The content of the minor constituent monomer-derived minor constituent monomer unit in the all monomer units in the modified PTFE is generally within the range of 0.001 to 1 mole percent.

The term "minor constituent monomer unit" as used herein means a partial element of the molecular structure of the fluoropolymer and is the moiety derived from the corresponding fluoromonomer. For example, the TEF unit is a partial element of the molecular structure of the fluoropolymer and is the TFE-derived moiety; it is represented by —($CF_2$—$CF_2$)—. The "all monomer units" so referred to hereinabove include all the monomer-derived moieties constituting the molecular structure of the fluoropolymer. The "content (mole percent) of the minor constituent monomer unit in the all monomer units" so referred to herein means the mole fraction (mole percent) of the minor constituent monomer, from which the above-mentioned minor constituent monomer unit is derived, relative to the total amount of the monomers from which the "all monomer units" mentioned above are derived, namely of the monomers that have served to constitute the fluoropolymer.

The content of the minor constituent monomer unit relative to the above-mentioned all monomer units in the modified PTFE is preferably at a low level so that the dielectric loss tangent of the molded article obtained may be low. A preferred upper level is 0.1 mole percent.

The polytetrafluoroethylene resin (A) mentioned above is preferably a TFE homopolymer in view of the fact that the dielectric loss tangent of the molded article obtained is low when such homopolymer is used.

The polytetrafluoroethylene resin (A) is preferably one having a number average molecular weight of 35 to $80 \times 10^5$.

As the number average molecular weight of the polytetrafluoroethylene resin (A) increases, the moldability of the resin tends to become poor and, when it is too low, decreases in mechanical strength and electrical characteristics are readily caused. A more preferred lower limit to the number average molecular weight of the polytetrafluoroethylene resin (A) is $40 \times 10^5$, whereas a more preferred upper limit thereto is $70 \times 10^5$.

The "number average molecular weight" so referred to herein is calculated from the standard specific gravity measured by the water displacement method according to ASTM D-792 using a sample molded in accordance with ASTM D-4895 98.

The polytetrafluoroethylene resin (A) has a maximum peak temperature [$T_1$] on the endothermic curve as appearing in the crystal melting curve measured using a differential scanning calorimeter which temperature is higher by at least 3° C. than the maximum peak temperature [$T_2$] on the endothermic curve as appearing in the crystal melting curve measured after heating at 340° C. or above using a differential scanning calorimeter.

The maximum peak temperature [$T_1$] is preferably higher by at least 5° C., more preferably higher by at least 10° C., than the maximum peak temperature [$T_2$]. So long as the maximum peak temperature [$T_1$] is within the above temperature range, the temperature range exceeding the maximum peak temperature [$T_2$] may be narrower than 21° C. or, further, narrower than 15° C.

The "endothermic curve" so referred to hereinabove is the one obtained by using a differential scanning calorimeter and raising the temperature at a rate of 10° C. per minute.

As is evident from the fact that it has such a maximum peak temperature [$T_1$] as mentioned above, the polytetrafluoroethylene resin (A) has no history of sintering after polytetrafluoroethylene polymerization. The above-mentioned "heating at 340° C. or above" means sintering of the "polytetrafluoroethylene resin (A)".

In the present specification, heating of the polytetrafluoroethylene resin (A) at a temperature not lower than the melting point thereof defined later herein is sometimes referred to as "sintering". The fact that the polytetrafluoroethylene resin (A) has no history of heating at a temperature not lower than the melting point thereof is sometimes referred to as "non-sintered" or "semi-sintered".

The sintering can be carried out, for example, by heating at a temperature of 340° C. for 5 minutes, although the sintering conditions may vary depending on the shape (e.g. thickness), on the occasion of heating, of the molded article comprising the polytetrafluoroethylene resin (A).

The melting point of the polytetrafluoroethylene resin (A) is preferably within the range of 340±7° C.

In view of the moldability of the molded article to be obtained, a more preferred lower limit to the melting point of the polytetrafluoroethylene resin (A) is 338° C. and a more preferred upper limit thereto is 342° C.

The melting point of the polytetrafluoroethylene resin (A) as so referred to herein is determined by measuring the endothermic peak using a differential scanning calorimeter under the programming rate condition of 10° C./minute.

The polytetrafluoroethylene resin (A) can be produced in the conventional manner, for example by emulsion polymerization, suspension polymerization or solution polymerization, according to the intended use of the molded article, the method of molding, and the method of preparing the mixture with the thermoplastic resin (B) to be described later herein, among others. From the moldability viewpoint, however, the one obtained by emulsion polymerization is preferred.

In cases where the polytetrafluoroethylene resin (A) is one obtained by emulsion polymerization, for instance, the dispersion just after polymerization as obtained by emulsion polymerization or a concentrate thereof may be used or the powder taken out from that dispersion by a coagulation procedure. Such powder obtained by emulsion polymerization is sometimes referred to as "fine powder".

The resin particles (primary particles) in the dispersion of the polytetrafluoroethylene resin (A) just after polymerization generally have an average particle diameter (average primary particle diameter) of 0.1 to 0.5 µm. A preferred lower limit to the above average primary particle diameter is 0.2 µm, and a preferred upper limit thereto is 0.3 µm.

The primary particle diameter so referred to herein is the one obtained by the gravity precipitation method.

The thermoplastic resin (B) mentioned above is a thermoplastic resin having a melting point of not lower than 100° C. but lower than 322° C.

In view of the thermal resistance of the molded article obtained, for example an antenna, the melting point mentioned above is more preferably not lower than 120° C. and, in view of the mechanical strength and the ease of temperature setting in the step of heat treatment to be described later herein, it is preferably not higher than 300° C.

In measuring the melting point of the thermoplastic resin (B), any appropriate method known in the art can be used according to the resin species. For example, that melting point can be determined by measuring the endothermic peak under the temperature programming condition of 10° C./minute using a differential scanning calorimeter.

Since the thermoplastic resin (B) has a melting point within the range mentioned above, the molded article of the invention can retain its dimensional stability during the use thereof at relatively low temperatures, for example at room temperature to below 100° C., and undergoes no changes in transmission characteristics and, therefore, can be suitably used in those fields of application where high levels of high-frequency transmission characteristics are required.

The thermoplastic resin (B) may be, for example, a polyolefin resin or a fluororesin.

The polyolefin resin may be, for example, a polypropylene [PP] resin or a polyethylene [PE] resin.

As for the polypropylene [PP] resin, the propylene polymer constituting the resin may be a propylene homopolymer or a copolymer of propylene as the major monomer and a monomer copolymerizable with propylene. The propylene copolymer may be, for example, a propylene/ethylene copolymer resulting from random or block copolymerization of propylene and ethylene.

The above-mentioned fluororesin may be a melt-processable fluororesin.

As the melt-processable fluororesin, there may be mentioned, among others, tetrafluoroethylene/perfluoro(alkyl vinyl ether) [TFE/PAVE] copolymer resins, tetrafluoroethylene/hexafluoropropylene copolymer [FEP] resins, tetrafluoroethylene/ethylene copolymer [ETFE] resins, and ethylene/tetrafluoroethylene/hexafluoropropylene copolymer [EFEP] resins.

As the TFE/PAVE copolymer resins, there may be mentioned tetrafluoroethylene/perfluoro(methyl vinyl ether) copolymer [MFA] resins, and tetrafluoroethylene/perfluoro(propyl vinyl ether) copolymer [PFA] resins, among others.

Preferred as the above fluororesin are PFA resins and FEP resins.

Preferred as the thermoplastic resin (B) are FEP resins, TFE/PAVE copolymer resins and polyolefin resins in view of their being excellent in thermal resistance and capable of giving molded articles which can be stably used at relatively high temperatures.

Preferred as the above-mentioned TFE/PAVE copolymer resins are MFA resins and PFA resins.

The thermoplastic resin (B) preferably has a melt flow rate (MFR) at 372° C. of 0.5 to 80 (g/10 minutes). A more preferred lower limit to the above MFR is 8 (g/10 minutes), a more preferred upper limit thereto is 50 (g/10 minutes) and a still more preferred upper limit is 25 (g/10 minutes).

The melt viscosity, so referred to herein, is measured in accordance with ASTM D 2116.

The thermoplastic resin (B) is low in melt viscosity and therefore can sufficiently fill spaces among particles comprising the polytetrafluoroethylene resin (A) or among oriented particles thereof as a result of molding processing in the step of heat treatment, which is to be described later herein, and, even when the oriented particles are fibrillated, the resin (B) can fill spaces so that the fibrils may be entangled; the resin solidifies in such a state upon cooling. Therefore, the molded article of the invention is excellent in mechanical strength and, in the case of its being a core wire-coating material, it will cause no fibrillation on the occasion of being cut in the lengthwise direction, thus showing good terminal processability.

On the other hand, the thermoplastic resin (B) is higher in relative permittivity and dielectric loss tangent than polytetrafluoroethylene resins and, therefore, the art has refrained from incorporating such resin in moldings in which the electric characteristics of a polytetrafluoroethylene resin are to be made the most of.

However, the molded article of the invention, in spite of the use of a thermoplastic resin inferior in electric characteristics than polytetrafluoroethylene resins, can now show good mechanical strength and terminal processability without impairing the relative permittivity and dielectric loss characteristics of the molded articles obtained by using a polytetrafluoroethylene resin alone.

The number average molecular weight of the thermoplastic resin (B) is not particularly restricted but preferably is within the range of 1000 to 500000. When the number average molecular weight is excessively high, the moldability may decrease and, when it is excessively low, the mechanical strength of the molded article obtained may become low in certain instances.

The thermoplastic resin (B) can be produced in the conventional manner. When an aqueous dispersion of a fluororesin is used in preparing a mixture with the polytetrafluoroethylene resin (A), as described later herein, however, the resin (B) is preferably one produced by emulsion polymerization.

In the molded article of the invention, the thermoplastic resin (B) preferably amounts to 1 to 60% by mass of the sum of the polytetrafluoroethylene resin (A) and the thermoplastic resin (B).

A preferred lower limit to the above content is 5% by mass, a more preferred lower limit is 10% by mass, while a preferred upper limit is 50% by mass, a more preferred upper limit is 40% by mass, and a still more preferred upper limit is 30% by mass.

When the above content is above 60% by mass, the dielectric loss tangent becomes great, hence the electric characteristics may deteriorate and, when it is lower than 1%, the hardness of the molded article obtained is low and, therefore, the terminal processability and mechanical strength may become low.

The molded article of the invention may further contain a foaming agent in addition to the polytetrafluoroethylene resin (A) and thermoplastic resin (B) since it contributes to a decrease in relative permittivity and improvements in electric characteristics.

The foaming agent is not particularly restricted but may be any one capable of generating bubbles in the step of molding processing. For example, mention may be made of such decomposable compounds as carbonyl/sulfonyl hydrazides, azo compounds and inorganic compounds.

As the carbonyl/sulfonyl hydrazides, there may be mentioned 4,4'-oxybis(benzenesulfonyl hydrazide) and the like.

As the azo compounds, there may be mentioned, among others, azodicarbonamide and 5-phenyltetrazol.

The inorganic compounds include boron nitride, talc, sericite, diatomaceous earth, silicon nitride, fine silica, alumina, zirconia, powdered quartz, kaolin, bentonite, titanium oxide, etc.

The foaming agent is preferably added at a level of 0.1 to 5% by mass relative to the sum of the polytetrafluoroethylene resin (A) and thermoplastic resin (B).

The level of addition of the foaming agent may vary depending on the foaming agent species selected but, from the foaming efficiency viewpoint, it is more preferably not lower than 0.5% by mass and, from the dielectric loss tangent viewpoint, it is more preferably not higher than 1% by mass.

In the molded article of the invention, the polytetrafluoroethylene resin (A) constituting that molded article has such a maximum peak temperature [$T_1$] as specified above and remains in a non-sintered or semi-sintered condition. In the step of molding, the polytetrafluoroethylene resin (A) is not sintered but the thermoplastic resin (B) is melted and then solidified in that step to give the molded article.

PTFE, when heated at a temperature not lower than the melting point thereof, generally becomes increased in relative permittivity and dielectric loss tangent and, therefore, molded articles obtained therefrom by such heating are high in dielectric loss and low in transmission rate. On the other hand, molded articles obtained therefrom without heating at a temperature not lower than the melting point thereof are inferior in mechanical strength and, when they are coating materials for coating core wires, they cause stringing upon lengthwise terminal cutting off of the coatings, hence are inferior in terminal processability.

In the case of the molded article of the invention, the polytetrafluoroethylene resin (A) is in a non-sintered or semi-sintered condition and, therefore, the molded article is low in relative permittivity and dielectric loss tangent and excellent in electric characteristics and, in addition, the thermoplastic resin (B) is in a solidified condition while filling spaces among particles or oriented particles comprising the polytetrafluoroethylene resin (A), so that the molded article is superior in mechanical strength and in terminal processability as well.

The molded article of the invention, which is excellent in mechanical strength, is superior in dimensional stability and hardly shows changes in relative permittivity and, therefore, when it is used as a product for high-frequency signal transmission, the rate of transmission can be maintained stably.

The dielectric loss tangent, expressed as tan δ, of molded article of the invention is preferably not greater than $2.0 \times 10^{-4}$. A preferred upper limit to the dielectric loss tangent is $0.8 \times 10^{-4}$ and a more preferred upper limit is $0.7 \times 10^{-4}$.

So long as the dielectric loss tangent is within the above range, the lower limit thereto may be set at $0.15 \times 10^{-4}$, for instance, and, more generally, it may be set at $0.2 \times 10^{-4}$.

In the case of the molded article of the invention, the relative permittivity (Er) is generally 1.7 to 2.3. The lower limit to the relative permittivity may be set at 1.8, and a preferred upper limit thereto is 2.0.

The non-sintered PTFE generally has a density of about 1.7 and its relative permittivity is as low as about 1.7, and the molded article of the invention, which comprises non-sintered PTFE and/or semi-sintered PTFE, becomes low in relative permittivity.

The dielectric loss tangent and relative permittivity, so referred to herein, are respectively obtained by measuring changes in resonance frequency and electric field strength at a temperature of 20 to 25° C. using a network analyzer and calculating the values at 12 GHz.

The molded article of the invention, which is low not only in dielectric loss tangent but also in relative permittivity, is low in dielectric loss and can be adequately used as an insulator. In particular, it is suitably used as an insulator in a product for high-frequency signal transmission where a low dielectric loss and a stable high transmission rate are required.

When the molded article of the invention is used as an insulator of such a high-frequency transmission cable as described later herein, for instance, the transmission loss generally includes two classes, namely the loss due to the electric insulation resistance of the conductor and the loss due to the dielectric loss ($\alpha_K$).

The dielectric loss is expressed as a function of the relative permittivity and dielectric loss tangent, as shown by the general formula given below, and is proportional to the dielectric loss tangent.

$$\text{(Dielectric loss } \alpha_K) = K \cdot (\in_r)^{1/2} \cdot \tan \delta \cdot f \text{(dB/m)}$$

K: constant; $\in_r$: relative permittivity; f: frequency

The molded article of the invention, when used as an insulator of such a high-frequency transmission cable as described later herein, for instance, is low in dielectric loss and makes it possible to reduce the transmission loss and is suited for use as an insulator, in particular as an insulator in such a product for high-frequency signal transmission as a high-frequency transmission cable.

The molded article of the invention can be obtained, for example, by the method of producing molded articles according to the invention.

The method of producing molded articles according to the invention comprises subjecting a polytetrafluoroethylene resin (A) and a thermoplastic resin (B) having a melting point of not lower than 100° C. but lower than 322° C. to heat treatment.

The method of producing molded article according to the invention preferably comprises subjecting the polytetrafluoroethylene resin (A) mentioned above and the thermoplastic resin (B) mentioned above to molding processing to form a desired shape and carrying out the heat treatment simultaneously with or after the molding process.

Considering the homogeneity of the molded article to be obtained, the polytetrafluoroethylene resin (A) and thermoplastic resin (B) are preferably mixed up in advance prior to molding processing to form a desired shape.

As the method of preparing a mixture of the polytetrafluoroethylene resin (A) and thermoplastic resin (B), there may be mentioned, among others, (i) the dry mixing method (dry blending method) which comprises mixing up a powder comprising the polytetrafluoroethylene resin (A) and a powder mixing the thermoplastic resin (B), (ii) the cocoagulation method which comprises adding a powder comprising either one of the polytetrafluoroethylene resin (A) and the thermoplastic resin (B) to an aqueous dispersion containing the other resin, followed by coagulation, and (iii) the cocoagulation method which comprises mixing an aqueous dispersion comprising the polytetrafluoroethylene resin (A) with an aqueous dispersion comprising the thermoplastic resin (B) for coagulation. Among them, the cocoagulation method (ii) or (iii) is preferred, and the cocoagulation method (iii) is more preferred, since sufficient mixing can be attained and homogeneous molded articles excellent in mechanical strength and electric characteristics can be readily obtained.

In preparing the mixture mentioned above, the mixing ratio between the polytetrafluoroethylene resin (A) and thermoplastic resin (B) can be adequately selected according to the respective resin species to be used. Preferably, however, the thermoplastic resin (B) amounts to 1 to 60% by mass relative to the sum of the polytetrafluoroethylene resin (A) and thermoplastic resin (B).

Considering the terminal processability and mechanical strength of the molded articles to be obtained, a preferred lower limit to the content of the thermoplastic resin (B) is 5% by mass, a more preferred lower limit is 10% by mass and, in view of the electric characteristics of the molded articles to be obtained, a preferred upper limit is 50% by mass, a more preferred upper limit is 40% by mass, and a still more preferred upper limit is 30% by mass.

As for the cocoagulation method (iii), the means for cocoagulation is not particularly restricted but preferably comprises causing a coagulant such as an inorganic acid or a metal salt thereof, among others, to act on a mixture prepared from an aqueous dispersion of the polytetrafluoroethylene resin (A) and an aqueous dispersion of the thermoplastic resin (B) each just after polymerization.

More preferably, the polytetrafluoroethylene resin (A) and thermoplastic resin (B) are almost identical in average particle size to each other so that the polytetrafluoroethylene resin (A) and thermoplastic resin (B) may be mixed up sufficiently to readily give a homogeneous mixture.

The method of molding processing to form a desired shape using the polytetrafluoroethylene resin (A) and thermoplastic resin (B) is not particularly restricted but may be selected, according to the intended use of the molded article, from among such conventional methods as compression molding, extrusion rolling molding, extrusion coating molding technique, wrapping tape technique, and calendering rolling technique.

The molding process may be carried out after addition of one or more processing aids and/or the like known in the art in addition to the polytetrafluoroethylene resin (A) and thermoplastic resin (B) so that the moldability may be improved and the mechanical strength and other physical properties of the molded article to be obtained may be improved, for instance.

The heat treatment mentioned above is carried out at a specific resin temperature.

The term "resin temperature" as used herein means the temperature of the mixture of the polytetrafluoroethylene resin (A) and thermoplastic resin (B) in the step of sintering in the process of molding thereof.

The heat treatment is generally applied to the desired molded article obtained in the above molding process and, preferably, the desired molded article is placed within a heating apparatus such as an oven. The temperature in the heating apparatus is generally set at a level higher by about 15 to 20° C. than the resin temperature. In cases where the desired molded article passes through the oven in about 1 minute, for instance, the resin temperature becomes lower by about 15 to 20° C. than the oven temperature.

The above-mentioned specific resin temperature is a temperature not lower than the melting point of the thermoplastic resin (B) but lower than the melting point of the polytetrafluoroethylene resin (A).

From the energy efficiency viewpoint, the specific resin temperature is preferably a temperature not so higher than the melting point of the thermoplastic resin (B), and a preferred lower limit is a temperature higher by 5° C. than the melting point of the thermoplastic resin (B) and a more preferred lower limit is a temperature higher by 10° C. than the melting point of the thermoplastic resin (B), although such limit may depend on the kind of the thermoplastic resin (B).

A preferred upper limit to the above specific resin temperature is a temperature lower by 5° C. than the melting point of the polytetrafluoroethylene resin (A) and a more preferred upper limit is a temperature lower by 100° C. than the melting point of the polytetrafluoroethylene resin (A) from the viewpoint of temperature setting for the heating apparatus so that the resin temperature may be lower than the melting point of the polytetrafluoroethylene resin (A) without fail, although such limit may depend on the melting point of the thermoplastic resin (B).

The method of producing molded articles of the invention uses the polytetrafluoroethylene resin (A) and the thermoplastic resin (B), which has a melting point within the above-specified range, and therefore it becomes possible to select the above-mentioned specific resin temperature within a wide range in the heat treatment step.

Since the above heat treatment is carried out at the specific resin temperature according to the method of the invention for producing molded articles, the polytetrafluoroethylene resin (A) in the molded article obtained remains non-sintered or semi-sintered, while the thermoplastic resin (B) has a history of melting and solidification. Therefore, the method of producing molded articles according to the invention can produce molded articles low in relative permittivity and dielectric loss tangent and excellent in mechanical strength and further in terminal processability, like the molded article of the invention as described hereinabove, in a simple and easy manner from the heat treatment temperature and control viewpoint.

A product for high-frequency signal transmission, which comprises the above-mentioned molded article of the invention, also constitutes an aspect of the present invention.

The product for high-frequency signal transmission is not particularly restricted but may be any of the products to be used in high-frequency signal transmission, including, among others, (1) molded sheets or boards such as high-frequency circuit insulating boards, connecting device insulators and printed wiring boards, (2) such molded articles as high-frequency vacuum tube bases and antenna covers, and (3) coated wires such as coaxial cables and cables for LAN.

The above-mentioned molded article of the invention can be suitably used as an insulator in such products for high-frequency signal transmission as mentioned above because of its low relative permittivity and dielectric loss tangent.

Among the molded sheets or boards mentioned above under (1), printed wiring boards are preferred since favorable electric characteristics can be obtained. The printed wiring boards involved are not particularly restricted but include, for example, printed electronic wiring boards for cellular phones, various computers, and communications apparatus.

Among the molded articles mentioned above under (2), antenna covers are preferred from the low dielectric loss tangent viewpoint.

The method of molding processing to produce the molded boards or sheets (1) and molded articles (2) is not particularly restricted but includes, among others, the method comprising mixing up the polytetrafluoroethylene resin (A) and thermoplastic resin (B), if desired together with one or more processing aids known in the art, and subjecting the mixture to compression molding or extrusion rolling molding, for instance.

Among the coated wires (3), high-frequency transmission cables are preferred since good thermal stability and electric characteristics can be obtained. Among the high-frequency transmission cables, coaxial cables are preferred.

The coaxial cables generally have a structure such that it results from lamination of an inner conductor, insulating coating layer, outer conductor layer and protective coating layer in that order from the central portion toward the periphery. The thickness of each layer in the above structure is not particularly restricted but, generally, the inner conductor has a diameter of about 0.1 to 3 mm, the insulating coating layer has a thickness of about 0.3 to 3 mm, the outer conductor layer has a thickness of about 0.5 to 10 mm, and the protective coating layer has a thickness of about 0.5 to 2 mm.

The high-frequency transmission cables can be produced in the conventional manner, for example, by the method described in Japanese Kokai Publication 2001-357729, or by the method described in Japanese Kokai Publication H09-55120.

In accordance with the present invention, the high-frequency transmission cables comprise the molded article of the invention as the insulating coating layer.

The method of molding processing to adapt the molded article of the invention to the insulating coating layer is not particularly restricted but includes, among others, the extrusion coating molding technique, tape wrapping technique and calendering technique. Among such molding processing techniques, the extrusion coating molding technique is preferred, and the extrusion coating molding is preferably carried out in the manner of paste extrusion molding.

As a method of paste extrusion molding, there may be mentioned, for example, the method which comprises admixing a paste extrusion auxiliary with a powdery mixture comprising the polytetrafluoroethylene resin (A) preferably obtained by emulsion polymerization and the thermoplastic resin (B), feeding the mixture to a paste extruder, extruding the mixture so as to coat the core wire and, after heating for dying at a temperature of 100 to 250° C., subjecting the whole to heat treatment at the above-mentioned specific resin temperature for sintering.

EFFECTS OF THE INVENTION

The molded article of the invention, which has the constitution described hereinabove, is low in relative permittivity and dielectric loss tangent, and therefore low in dielectric loss, and excellent in mechanical strength and terminal processability. The method of the invention for producing molded articles, which has the constitution described hereinabove, can produce such a molded article as mentioned above in a simple and easy manner from the heat treatment temperature and control viewpoint. The product for high-frequency signal transmission according to the invention comprises the molded article of the invention and, therefore, low in dielectric loss and excellent in mechanical strength and dimension stability, and high and stable in high-frequency transmission rate.

BEST MODES FOR CARRYING OUT THE INVENTION

The following Examples and Comparative Examples illustrate the present invention in further detail. These are, however, by no means limitative of the scope of the invention.

In the Examples and Comparative Examples, the following evaluation methods were used.
(1) Resin temperature: Evaluated using a contact thermometer.
(2) Melting point: Calculated after endothermic peak measurement using a differential scanning calorimeter (RDC220; product of Seiko Denshi Kogyo) under the programmed temperature condition of 10° C./minute.

Example 1

1. Cocoagulation of a PTFE Resin and a PFA Resin

For mixture preparation by the cocoagulation method described above under (iii), a cylindrical stirring vessel (capacity 5000 mL) having a diameter of 180 mm and having a stirrer equipped with an anchor impeller (cylinder outside diameter 80 mm, height 50 mm) at the lower end of the shaft thereof was charged with 1000 g of an aqueous PTFE dispersion containing 30% by mass of particles comprising a TFE homopolymer obtained by emulsion polymerization (number average molecular weight $46 \times 10^5$, average primary particle diameter 0.28 µm, melting point 343° C.). Then, 92.8 g of an aqueous PFA dispersion containing 17% by mass of PFA particles (number average molecular weight $5 \times 10^5$, average primary particle diameter 0.18 µm, melting peak temperature 312° C.) was added and, further addition of 1.5 mL of nitric acid, the mixture was stirred for about 3 minutes. In about one minute after starting stirring, the mixture became a slurry and, in about 2 minutes after starting stirring, a powdery matter appeared.

After stirring, the resulting solid was recovered and washed twice with water, each time for about 1 minute, and the thus-obtained wet powder was dried at a temperature of 130° C. for 10 hours.

A cocoagulate powder consisting of 95% by mass of the PTFE resin and 5% by mass of the PFA resin was obtained.

2. Molding Processing

With the above cocoagulate powder was admixed an extrusion auxiliary (Isopar G, product of Esso Chemical) in an amount of 20.5% by mass of the total mass of the cocoagulate powder, followed by 12 hours of maturation at a temperature of 25° C. Thereafter, the mixture was fed to a preforming machine for preforming at a pressure of 3 MPa, and the preformed product was extruded into beads with a diameter of 8 mm using a paste extruder (product of Jennings) having a cylinder diameter of 38 mm. The beads were then heated to 60° C. using warm water at 80° C. and rolled out to a thickness of 500 µm using metal rolls with a diameter of 500 mm to give 80-mm square sheets. The sheets obtained were dried at a temperature of 200° C. for 5 minutes to thereby evaporate the extrusion auxiliary and then allowed to stand in a constant-temperature oven maintained at a temperature of 350° C. for 1 minute for heat treatment to give sheets (1).

3. Evaluation of Molded Articles (1) Relative Permittivity and Dielectric Loss Tangent (tan δ): The sheets thus obtained were measured for changes in resonance frequency and Qu value (electric field strength) at a temperature of 20 to 25° C. by the cavity resonator method using a network analyzer (HP8510C, product of Hewlett-Packard), and the respective values at 12 GHz were calculated.

(2) Terminal Processability: the Preformed Product prepared in the preforming machine was fed to an extruder (cylinder diameter 38 mm, mandrel diameter 16 mm, die orifice diameter 1.92 mm; product of Jennings) and extruded at a take-up speed of 5 m/minute for coating a core wire (American wire gage size 24: silver-plated copper-coated solid steel wire with a diameter of 0.511 mm). A coated cable having an insulating coating layer and an outside diameter of 1.68 mm was thus obtained.

The coating was peeled off from the coated cable obtained using a wire stripper, and the site of peeling was observed by the eye; when the insulating layer could be cut with ease without fiberization and the cut surface was neat, the terminal processability was evaluated as ⊚; when the insulating layer could be cut without fiberization and the cut surface was neat, as ○; when the insulating layer could be cut without fiberization but the cut surface was rough, as Δ; and when fragment fiberization occurred, as X.

Examples 2 to 5

Sheets were produced by the same method as used in Example 1 except that the mixing ratio between the PTFE resin and PFA resin was varied as shown in Table 1 and measured for relative permittivity and dielectric loss tangent and evaluated for terminal processability.

Furthermore, in Example 2, the sheet (1) and a sheet (2) obtained by heating the sheet (1) at a temperature of 340° C. for 5 minutes were subjected to melting point determination. The difference between the maximum peak ($T_1$) of the endothermic curve of the PTFE resin as appearing on the crystal melting curve obtained from melting point determination of the sheet (1) and the maximum peak ($T_2$) of the endothermic curve of the PTFE resin as appearing on the crystal melting curve obtained from melting point determination of the sheet (2) was 14° C.

Comparative Example 1

Sheets were produced in the same manner as in Example 1 except that the oven temperature was set at 380° C. for increasing the resin temperature to 360° C. The sheets were measured for relative permittivity and dielectric loss tangent, and the terminal processability was evaluated. The maximum peaks of both endothermic curves of the PTFE resin as appearing on the crystal melting curves measured in the same manner as in Example 2 showed a temperature difference of 1° C.

Comparative Example 2

Sheets were produced in the same manner as in Example 1 except that the oven temperature was set at 320° C. for lowering the resin temperature to 305° C. The sheets were measured for relative permittivity and dielectric loss tangent, and the terminal processability was evaluated.

The results are shown in Table 1.

Example 7

Sheets were produced in the same manner as in Example 2 except that FEP was used in lieu of the PFA and the oven temperature was set at 330° C. for attaining a resin temperature of 315° C. The sheets were measured for relative permittivity and dielectric loss tangent, and the terminal processability was evaluated.

Example 8

Sheets were produced in the same manner as in Example 3 except that FEP was used in lieu of the PFA and the oven temperature was set at 330° C. for attaining a resin temperature of 315° C. The sheets were measured for relative permittivity and dielectric loss tangent, and the terminal processability was evaluated.

Example 9

Sheets were produced in the same manner as in Example 4 except that FEP was used in lieu of the PFA and the oven temperature was set at 330° C. for attaining a resin temperature of 315° C. The sheets were measured for relative permittivity and dielectric loss tangent, and the terminal processability was evaluated.

Example 10

Sheets were produced in the same manner as in Example 5 except that FEP was used in lieu of the PFA and the oven temperature was set at 330° C. for attaining a resin temperature of 315° C. The sheets were measured for relative permittivity and dielectric loss tangent, and the terminal processability was evaluated.

TABLE 1

| | Resin B | Mixing ratio (by mass) (PTFE:Resin B) | Mixing method | Oven temperature (° C.) | Resin temperature (° C.) | Permittivity | tanδ (×10$^{-4}$) | Terminal processability |
|---|---|---|---|---|---|---|---|---|
| Example 1 | PFA | 95:5 | Cocoagulation (iii) | 350 | 335 | 1.8 | 0.3 | Δ |
| Example 2 | PFA | 90:10 | Cocoagulation (iii) | 350 | 335 | 1.8 | 0.5 | ○ |
| Example 3 | PFA | 85:15 | Cocoagulation (iii) | 350 | 335 | 1.8 | 0.8 | ○ |
| Example 4 | PFA | 80:20 | Cocoagulation (iii) | 350 | 335 | 1.8 | 1 | ○ |
| Example 5 | PFA | 70:30 | Cocoagulation (iii) | 350 | 335 | 1.8 | 1.5 | ○ |
| Comparative Example 1 | PFA | 90:10 | Cocoagulation (iii) | 380 | 360 | 2.1 | 2.3 | ⊚ |
| Comparative Example 2 | PFA | 90:10 | Cocoagulation (iii) | 320 | 305 | 1.8 | 0.5 | X |

It was found that the sheets obtained in Examples 1 to 5 were low in both relative permittivity and dielectric loss tangent.

On the other hand, the sheets obtained in Comparative Example 1 showed a high dielectric loss tangent value, namely 2.3×10$^{-4}$. This is probably due to the decrease in the crystallinity of the PTFE resin as a result of melting of the PTFE resin. The sheets obtained in Comparative Example 2 were low in dielectric loss tangent (0.5×10$^{-4}$) but the terminal processability was low. This is probably due to the low resin temperature at which the PFA could not be melted.

Example 6

Sheets were produced in the same manner as in Example 1 except that FEP was used in lieu of the PFA and the oven temperature was set at 330° C. for attaining a resin temperature of 315° C. The sheets were measured for relative permittivity and dielectric loss tangent, and the terminal processability was evaluated.

Comparative Example 3

Sheets were produced in the same manner as in Example 6 except that the oven temperature was set at 380° C. for attaining a resin temperature of 360° C. The sheets were measured for relative permittivity and dielectric loss tangent, and the terminal processability was evaluated.

Comparative Example 4

Sheets were produced in the same manner as in Example 6 except that the oven temperature was set at 250° C. for attaining a resin temperature of 240° C. The sheets were measured for relative permittivity and dielectric loss tangent, and the terminal processability was evaluated.

The results of Examples 6 to 10 and Comparative Examples 3 and 4 are shown in Table 2.

TABLE 2

| | Resin B | Mixing ratio (by mass) (PTFE:Resin B) | Mixing method | Oven temperature (° C.) | Resin temperature (° C.) | Permittivity | tanδ (×10⁻⁴) | Terminal processability |
|---|---|---|---|---|---|---|---|---|
| Example 6 | FEP | 95:5 | Cocoagulation (iii) | 330 | 315 | 1.8 | 0.3 | Δ |
| Example 7 | FEP | 90:10 | Cocoagulation (iii) | 330 | 315 | 1.8 | 0.6 | ○ |
| Example 8 | FEP | 85:15 | Cocoagulation (iii) | 330 | 315 | 1.8 | 0.9 | ○ |
| Example 9 | FEP | 80:20 | Cocoagulation (iii) | 330 | 315 | 1.8 | 1.3 | ○ |
| Example 10 | FEP | 70:30 | Cocoagulation (iii) | 330 | 315 | 1.8 | 2 | ○ |
| Comparative Example 3 | FEP | 90:10 | Cocoagulation (iii) | 380 | 360 | 2.1 | 2.4 | ⊚ |
| Comparative Example 4 | FEP | 90:10 | Cocoagulation (iii) | 250 | 240 | 1.8 | 0.7 | X |

It was found that the sheets obtained in Examples 6 to 10 were respectively low in both relative permittivity and dielectric loss tangent. On the other hand, the sheets obtained in Comparative Example 3 showed a high dielectric loss tangent value, namely $2.4 \times 10^{-4}$, although the terminal processability was excellent. This is probably due to the decrease in the crystallinity of the PTFE resin as a result of melting of the PTFE resin. In Comparative Example 4, the dielectric loss tangent was low, namely $0.5 \times 10^{-4}$ but the terminal processability was poor. This is probably due to the low resin temperature at which the FEP could not be melted.

Example 11

For mixture preparation by the cocoagulation method described above under (ii), a cylindrical stirring vessel (capacity 5000 mL) having a diameter of 180 mm and having a stirrer equipped with an anchor impeller (cylinder outside diameter 80 mm, height 50 mm) at the lower end of the shaft thereof was charged with 1000 g of the same TFE homopolymer particle-containing aqueous dispersion as used in Example 1. Then, about 33 g of a PFA powder obtained by emulsion polymerization (number average molecular weight $5 \times 10^5$, average primary particle diameter 0.18 μm, melting point 312° C.) was added and, after further addition of 1.5 mL of nitric acid, the mixture was stirred for about 3 minutes to give a powdery product.

The powdery product was washed twice with water, each time for about 1 minute, and then dried at a temperature of 130° C. for 10 hours.

A coagulate powder consisting of 90% by mass of the PTFE resin and 10% by mass of PFA was thus obtained.

With the above coagulate powder was admixed an extrusion auxiliary (Isopar G, product of Esso Chemical) in an amount of 20.5% by mass of the total mass of the coagulate powder, followed by 12 hours of maturation at a temperature of 25° C. Thereafter, the mixture was fed to a preforming machine for preforming at a pressure of 3 MPa, and the preformed product was extruded into beads with a diameter of 8 mm using a paste extruder (product of Jennings) having a cylinder diameter of 38 mm and a mandrel diameter of 16 mm. The beads were further heated to 60° C. with warm water at 80° C. and rolled out to a thickness of 500 μm using metal rolls with a diameter of 500 mm to give 80-mm square sheets. The sheets obtained were dried in a drying oven at a temperature of 200° C. for 5 minutes to thereby evaporate the extrusion auxiliary and then allowed to stand in a constant-temperature oven maintained at a temperature of 350° C. for 1 minute for heat treatment.

The relative permittivity and dielectric loss tangent were determined and the terminal processability was evaluated in the same manner as in Example 1.

Example 12

A mixed powder was prepared by mixing up 300 g of a fine PTFE powder (number average molecular weight $46 \times 10^5$, average particle diameter 0.28 μm, melting point 343° C.) and about 33.3 g of the same fine PFA powder as used in Example 11 according to the dry mixing method described above under (i). To the mixed powder obtained was added an extrusion auxiliary (Isopar G, product of Esso Chemical) in an amount of 20.5% by mass relative to the total mass of the mixed powder, followed by 12 hours of maturation at a temperature of 25° C. The mixture was then fed to a preforming machine for preforming at a pressure of 3 MPa, and the preformed product was extruded into beads with a diameter of 8 mm using a paste extruder (product of Jennings) having a cylinder diameter of 38 mm and a mandrel diameter of 16 mm. The beads were further heated to 60° C. using warm water at 80° C. and rolled out to a thickness of 500 μm using metal rolls with a diameter of 500 mm to give 80-mm square sheets. The sheets obtained were dried in a drying oven at a temperature of 200° C. for 5 minutes to thereby evaporate the extrusion auxiliary and then allowed to stand in a constant-temperature oven maintained at a temperature of 350° C. for 1 minute for heat treatment.

The relative permittivity and dielectric loss tangent were determined and the terminal processability was evaluated in the same manner as in Example 1.

Example 13

Sheets were produced in the same manner as in Example 11 except that a FEP powder (number average molecular weight $5 \times 10^5$, average particle diameter 0.15 μm, melting point 270° C.) was used in lieu of the PFA powder (number average molecular weight $5 \times 10^5$, average primary particle diameter 0.18 μm, melting point 312° C.) and that the oven temperature was set at 330° C. for attaining a resin temperature of 315° C. The sheets were measured for relative permittivity and dielectric loss tangent, and the terminal processability was evaluated.

Example 14

Sheets were produced in the same manner as in Example 12 except that the same fine FEP powder as used in Example 13 was used in lieu of the PFA powder (number average molecular weight $5 \times 10^5$, average primary particle diameter 0.18 μm, melting point 312° C.) and that the oven temperature was set at 330° C. for attaining a resin temperature of 315° C. The sheets were measured for relative permittivity and dielectric loss tangent, and the terminal processability was evaluated.

Example 15

Sheets were produced in the same manner as in Example 12 except that a PP powder (trademark: Flo-blen; product of Sumitomo Seika Chemicals) was used in lieu of the fine PFA powder and the oven temperature was set at 230° C. for attaining a resin temperature of 220° C. The sheets were measured for relative permittivity and dielectric loss tangent, and the terminal processability was evaluated.

Example 16

Sheets were produced in the same manner as in Example 12 except that a PE powder (trademark: Flothene UF; product of Sumitomo Seika Chemicals) was used in lieu of the fine PFA powder and Isopar E (trademark, product of Esso Chemical) was used as the extrusion auxiliary and that the drying temperature was adjusted to 130° C. and the oven temperature was set at 180° C. for attaining a resin temperature of 170° C. The sheets were measured for relative permittivity and dielectric loss tangent, and the terminal processability was evaluated.

The results of Examples 11 to 16 are shown in Table 3.

A coagulate powder consisting of 70% by mass of the PTFE resin and 30% by mass of the low-molecular-weight PTFE resin was thus obtained.

With the above coagulate powder was admixed an extrusion auxiliary (Isopar G, product of Esso Chemical) in an amount of 20.5% by mass of the total mass of the coagulate powder, followed by 12 hours of maturation at a temperature of 25° C. Thereafter, the mixture was fed to a preforming machine for preforming at a pressure of 3 MPa, and the preformed product was extruded into beads with a diameter of 8 mm using a paste extruder (product of Jennings) having a cylinder diameter of 38 mm and a mandrel diameter of 16 mm. The beads were further heated to 60° C. with warm water at 80° C. and rolled out to a thickness of 500 μm using metal rolls with a diameter of 500 mm to give 80-mm square sheets. The sheets obtained were dried in a drying oven at a temperature of 200° C. for 5 minutes to thereby evaporate the extrusion auxiliary and then allowed to stand in a constant-temperature oven maintained at a temperature of 345° C. for 1 minute for heat treatment.

The relative permittivity and dielectric loss tangent were determined and the terminal processability was evaluated in the same manner as in Example 1.

Comparative Example 6

Sheets were produced in the same manner as in Example 1 except that 0 (zero) g of PFA was used and the fine PTFE

TABLE 3

| | Resin B | Mixing ratio (by mass) (PTFE:Resin B) | Mixing method | Oven temperature (° C.) | Resin temperature (° C.) | Permittivity | tanδ (×10$^{-4}$) | Terminal processability |
|---|---|---|---|---|---|---|---|---|
| Example 11 | PFA | 90:10 | Cocoagulation (ii) | 350 | 335 | 1.8 | 0.5 | ◯ |
| Example 12 | PFA | 90:10 | Dry mixing | 350 | 335 | 1.8 | 0.5 | ◯ |
| Example 13 | FEP | 90:10 | Cocoagulation (ii) | 330 | 315 | 1.8 | 0.6 | ◯ |
| Example 14 | FEP | 90:10 | Dry mixing | 330 | 315 | 1.8 | 0.6 | ◯ |
| Example 15 | PP | 90:10 | Dry mixing | 230 | 220 | 2.2 | 0.5 | ◯ |
| Example 16 | PE | 90:10 | Dry mixing | 180 | 170 | 2.2 | 0.6 | ◯ |

It was found that the respective sheets obtained in Examples 11 to 16 are low in both relative permittivity and dielectric loss tangent. The terminal processability was good in each of the examples.

Comparative Example 5

For mixture preparation by the cocoagulation method described above under (ii), a cylindrical stirring vessel (capacity 5000 mL) having a diameter of 180 mm and having a stirrer equipped with an anchor impeller (cylinder outside diameter 80 mm, height 50 mm) at the lower end of the shaft thereof was charged with 1000 g of the same TFE homopolymer particle-containing aqueous dispersion as used in Example 1. Then, about 43 g of a low-molecular-weight PTFE resin (trademark: Lubron, product of Daikin Industries) obtained by emulsion polymerization was added and, after further addition of 1.5 mL of nitric acid, the mixture was stirred for about 3 minutes.

After stirring, the resulting powder was washed twice with water, each time for about 1 minute, and then dried at a temperature of 130° C. for 10 hours.

powder alone was used. The sheets were measured for relative permittivity and dielectric loss tangent, and the terminal processability was evaluated.

Sheets were produced by molding processing of the coagulate powder obtained in the same manner as in Comparative Example 5 except that the oven temperature and resin temperature were varied as shown in Table 4. The relative permittivity and dielectric loss tangent were determined and the terminal processability was evaluated in the same manner as in Example 1.

Comparative Example 7

Using the fine PTFE powder alone, like in Comparative Example 6, sheets were produced by molding processing of the coagulate powder obtained in the same manner as in Comparative Example 5 except that the oven temperature and resin temperature were varied as shown in Table 4. The relative permittivity and dielectric loss tangent were determined and the terminal processability was evaluated in the same manner as in Example 1.

The results of Comparative Examples 5 to 7 are shown in Table 4.

TABLE 4

|  | Resin B | Mixing ratio (by mass) (PTFE:Resin B) | Mixing method | Oven temperature (° C.) | Resin temperature (° C.) | Permittivity | tanδ (×10⁻⁴) | Terminal processability |
|---|---|---|---|---|---|---|---|---|
| Comparative Example 5 | Low-molecular-weight PTFE | 70:30 | Cocoagulation (ii) | 345 | 335 | 1.9 | 0.6 | Δ |
| Comparative Example 6 | — | 100:0 | — | 400 | 380 | 2.1 | 2.1 | ⊚ |
| Comparative Example 7 | — | 100:0 | — | 330 | 310 | 1.7 | 0.2 | X |

In Comparative Example 5, the terminal processability was not so good. As for Comparative Examples 6 and 7, the terminal processability was excellent in Comparative Example 6, in which the same TFE homopolymer particles as used in Example 1 was sintered and melted, but the relative permittivity and dielectric loss tangent were high whereas, in Comparative Example 7, the sheets obtained from the same TFE homopolymer particles as used in Example 1, with the TFE homopolymer remaining in a semi-sintered condition without melting, were low in relative permittivity and dielectric loss tangent but inferior in terminal, processability.

INDUSTRIAL APPLICABILITY

The molded article of the invention which has the constitution described hereinabove, is low in relative permittivity and dielectric loss tangent and has both mechanical strength and terminal processability. The method of producing molded articles according to the invention, which has the constitution described hereinabove, can produce such a molded article as mentioned above in a simple and easy manner with respect to the heat treatment temperature and control. The product for high-frequency signal transmissions according to the invention comprises the molded article of the invention and, therefore, is reduced in the dielectric loss and excellent in mechanical strength and terminal processability.

The invention claimed is:

1. A molded article prepared from a resin composition comprising:
    a polytetrafluoroethylene resin (A); and
    a thermoplastic resin (B) having a melting point of not lower than 100° C. but lower than 322° C. in an amount of 1 to 60% by mass of the sum of the polytetrafluoroethylene resin (A) and said thermoplastic resin (B),
    wherein said molded article is prepared from said composition by an extrusion coating molding technique or a wrapping tape technique, and when said molded article is compared with a heated molded article obtained by heating said molded article to a temperature of not lower than 340° C., the maximum peak temperature of the endothermic curve appearing on the crystal melting curve of said polytetrafluoroethylene resin (A) of said molded article without said heating as measured by a differential scanning calorimeter is higher by at least 3° C. than the maximum peak temperature of the endothermic curve appearing on the crystal melting curve of said polytetrafluoroethylene resin (A) of said heated molded article as measured by said differential scanning calorimeter.

2. The molded article according to claim 1, wherein the thermoplastic resin (B) comprises a tetrafluoroethylene/hexafluoropropylene copolymer, a tetrafluoroethylene/perfluoro(alkyl vinyl ether) copolymer and/or a polyolefin resin.

3. A method of producing a molded article comprising:
    subjecting a resin composition comprising a polytetrafluoroethylene resin (A) and a thermoplastic resin (B) having a melting point of not lower than 100° C. but lower than 322° C. in an amount of 1 to 60% by mass of the sum of the polytetrafluoroethylene resin (A) and said thermoplastic resin (B) to heat treatment during an extrusion coating molding technique or wrapping technique at a specific resin temperature,
    wherein said specific resin temperature is not lower than the melting point of said thermoplastic resin (B) but lower than the melting point of said polytetrafluoroethylene resin (A).

4. A product for high-frequency signal transmission comprising the molded article according to claim 1.

5. The product for high-frequency signal transmission according to claim 4, which is a printed wiring board.

6. The product for high-frequency signal transmission according to claim 4, which is an antenna cover.

7. A high-frequency transmission cable, which comprises the molded article according to claim 1 as an insulating coating layer.

8. A molded article prepared by a process comprising:
    molding a mixture comprising fluoropolymers having different melting points, wherein said mixture comprises:
    a polytetrafluoroethylene resin (A) which is a homopolymer of tetrafluoroethylene or a copolymer of tetrafluoroethylene and less than 1 mole percent of hexafluoropropylene and which has a first melting point of 340+7° C.; and
    a thermoplastic resin (B) which is a tetrafluoroethylene/perfluoro(alkyl vinyl ether) copolymer or tetrafluoroethylene/hexafluoropropylene copolymer, having a melting point of not lower than 100° C. but lower than 322° C.

9. A molded article formed by molding a mixture comprising fluoropolymers having different melting points, wherein said mixture comprises (A) about 70-95 wt % of polytetrafluoroethylene having a melting point of 340+7° C., and (B) about 30-5 wt % of lower melting fluoropolymer having a melting point of not lower than 100° C. but lower than 322° C. which is a tetrafluoroethylene/perfluoro(alkyl vinyl ether) copolymer or tetrafluoroethylene/hexafluoropropylene copolymer, to total 100 wt %.

10. A molded article which is produced by heat-treating at a specific resin temperature a composition comprising:
    a polytetrafluoroethylene resin (A) which is a homopolymer of tetrafluoroethylene or a copolymer of tetrafluoroethylene and less than 1 mole percent of hexafluoropropylene and which has a first melting point of about 343° C.;
    a thermoplastic resin (B) which is a tetrafluoroethylene/perfluoro(propyl vinyl ether) copolymer or tetrafluoroethylene/hexafluoropropylene copolymer, having a melting point of not lower than 100° C. but lower than 322° C.; and wherein said specific resin temperature is not lower than the melting point of said thermoplastic resin (B) but is lower than the melting point of said polytetrafluoroethylene resin (A).

11. The molded article of claim 10, wherein said specific resin temperature is about 335° C.

12. The molded article of claim 10, wherein said specific resin temperature is about 315° C.

13. The molded article of claim 10, wherein said composition comprises:

about 70-95 wt % of said polytetrafluoroethylene resin (A); and about 30-5 wt % of said thermoplastic resin (B).

14. The molded article of claim 10, wherein said thermoplastic resin (B) has a melting point of about 312° C.

15. A molded article comprising:

a polytetrafluoroethylene resin (A) which is a homopolymer of tetrafluoroethylene or a copolymer of tetrafluoroethylene and less than 1 mole percent of hexafluoropropylene and which has a first melting point of 340+7° C.; and a thermoplastic resin (B) which is a tetrafluoroethylene/perfluoro(alkyl vinyl ether) copolymer or tetrafluoroethylene/hexafluoropropylene copolymer, having a melting point of not lower than 100° C. but lower than 322° C.

16. The molded article of claim 15, wherein said thermoplastic resin (B) is a tetrafluoroethylene/perfluoro(propyl vinyl ether) copolymer.

17. The molded article of claim 15, wherein said polytetrafluoroethylene resin (A) has a first melting point of about 343° C.

18. The molded article of claim 15, wherein an average particle size of said polytetrafluoroethylene resin (A) is about equal to an average particle size of said thermoplastic resin (B).

19. The molded article according to claim 1, wherein the molded article has a relative permittivity of 1.7 to 2.0.

* * * * *